(12) United States Patent
Jackson et al.

(10) Patent No.: US 7,549,157 B1
(45) Date of Patent: Jun. 16, 2009

(54) AUTOMATIC GAIN-SETTING IN RELAYING DEVICE

(75) Inventors: David Jackson, Manlius, NY (US); Steven K. Shafer, Chittenango, NY (US); Stephen P. Malak, Manlius, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 0 days.

(21) Appl. No.: 11/972,711

(22) Filed: Jan. 11, 2008

(51) Int. Cl.
- H04N 7/16 (2006.01)
- H04N 7/173 (2006.01)
- H03G 3/20 (2006.01)
- H03G 5/16 (2006.01)

(52) U.S. Cl. ............... 725/149; 725/107; 330/129; 330/132

(58) Field of Classification Search ............ 725/149, 725/107; 330/129, 132
See application file for complete search history.

(56) References Cited

U.S. PATENT DOCUMENTS

| | | | |
|---|---|---|---|
| 3,755,737 A | | 8/1973 | Eller |
| 3,781,703 A | * | 12/1973 | Duty .................... 330/52 |
| 4,219,821 A | | 8/1980 | Selim |
| 4,558,358 A | * | 12/1985 | Onda .................... 725/107 |
| 4,910,791 A | * | 3/1990 | Dickinson et al. ........ 455/67.14 |
| 4,942,368 A | | 7/1990 | Moon |
| 5,398,114 A | | 3/1995 | Han |
| 5,771,015 A | | 6/1998 | Kirtman et al. |
| 6,681,100 B1 | | 1/2004 | Ge |
| 7,065,335 B2 | | 6/2006 | Ben-Ayun et al. |
| 2003/0119463 A1 | | 6/2003 | Lim |

FOREIGN PATENT DOCUMENTS

| | | |
|---|---|---|
| JP | 62-18673 | 1/1987 |
| JP | 7-284082 | 10/1995 |
| JP | 9-247056 | 9/1997 |
| JP | 11-69333 | 3/1999 |

* cited by examiner

*Primary Examiner*—Dominic D Saltarelli
(74) *Attorney, Agent, or Firm*—Alston & Bird LLP

(57) ABSTRACT

A relaying device has a content signal input port configured to receive a first electrical signal conveying information, a content signal output port configured to emit a second electrical signal conveying the information and configured to receive a reference signal, a gain regulation circuit in electrical communication with the content signal input port to establish a predetermined gain upon receipt of the reference signal at the content signal output port and generate the second electrical signal by applying the predetermined gain to the first electrical signal, and a control circuit disposed in electrical communication with each of the gain regulation circuit and the content signal output port to receive and measure the reference signal to establish the predetermined gain.

22 Claims, 3 Drawing Sheets

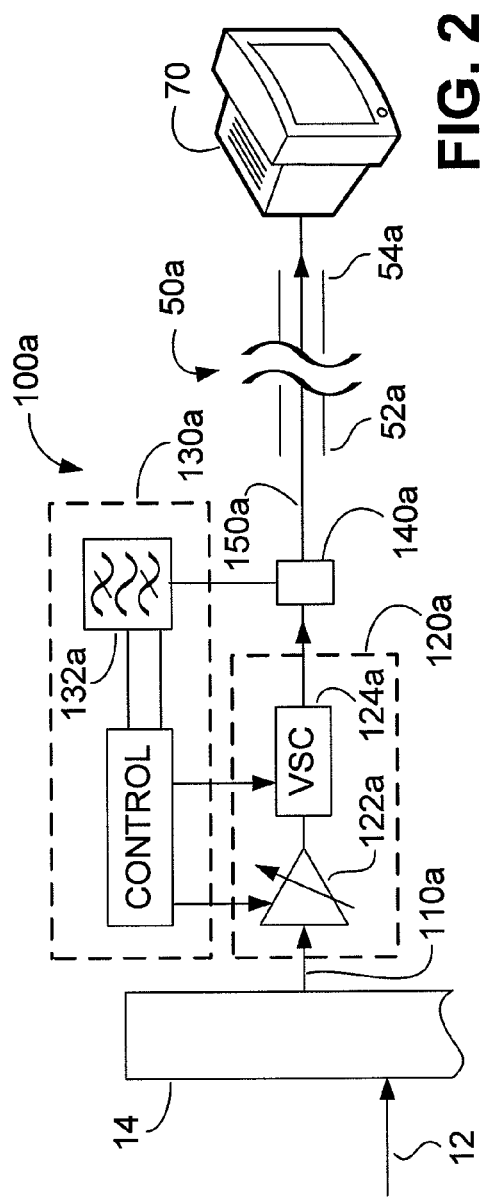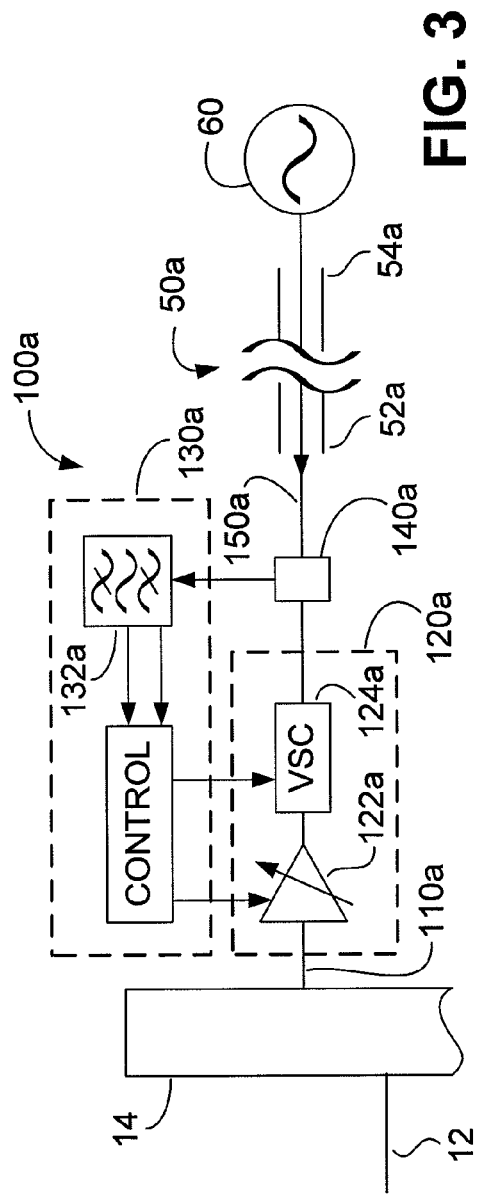

US 7,549,157 B1

AUTOMATIC GAIN-SETTING IN RELAYING DEVICE

FIELD OF THE INVENTION

This invention generally relates to the relaying of information along a transmission medium, and more particularly relates to automatically establishing predetermined gain applied by a relaying device.

BACKGROUND OF THE INVENTION

In many data distribution networks, electrical signals conveying information propagate along transmission lines across distances and through splitting and routing devices. Propagation along a typical transmission line imposes attenuation upon a signal, and many splitters are passive devices that divide an incoming signal into multiple outgoing signals having reduced signal strengths. Thus, as information propagates along a typical network, the electrical signals conveying the information can be degraded as they traverse some portion of the network. For example, in a typical cable television (CATV) network, media content propagates downstream from a head-end facility toward presentation and recording devices located in various facilities such as homes and businesses. Along the way, the electrical signals conveying the media content propagate along main trunks, through taps, and along multiple branches that ultimately distribute the content to drop lines at respective facilities. Thus, despite that robust signals are transmitted by the head-end facility, in a typical CATV network, amplification or repeating of propagating electrical signals is needed in order for media content to reliably reach subscribers.

Somewhat typically, a single connection in a information distribution network provides information to multiple devices, each of which relies on a particular transmission line, having arbitrary length or attenuation properties, branching from the single connection. For example, many homes and businesses have multiple media devices and respective transmission lines leading from a single CATV drop line to the devices, which are disposed in various rooms at various distances from the drop line. Thus, even if a signal of optimal strength arrives at a particular facility, signal splitting and attenuation can occur before information reaches downstream target devices.

Amplifiers are available for use as drop amps. A drop amp is an amplifier placed in-line upstream of a target device such as a information presentation, information recording, or information processing device. However, special training and calibration equipment are typically required if the gain of a drop amp is to be selected to compensate for the particular attenuation characteristics of a particular transmission line.

It would be desirable to provide improved devices, assemblies, and methods for compensating for the particular attenuation characteristics of a particular transmission path.

BRIEF SUMMARY OF THE INVENTION

The present invention addresses the above needs and enables other advantages by providing devices, assemblies, and methods for compensating for the particular attenuation characteristics of a particular transmission path such as a transmission line. In one aspect of the invention, a relaying device includes a content signal input port configured to receive a first electrical signal conveying information, a content signal output port configured to emit a second electrical signal conveying the information and configured to receive a reference signal, a gain regulation circuit in electrical communication with the content signal input port to establish a predetermined gain upon receipt of the reference signal at the content signal output port and generate the second electrical signal by applying the predetermined gain to the first electrical signal, and a control circuit disposed in electrical communication with each of the gain regulation circuit and the content signal output port to receive and measure the reference signal to establish the predetermined gain.

In another aspect of the invention, a relaying assembly includes a splitter configured to receive information and to provide multiple first electrical signals each conveying the information, and a plurality of relaying devices. Each relaying device includes a respective content signal input port disposed in electrical communication with the splitter and configured to receive a respective one of said first electrical signals, a respective content signal output port configured to emit a respective second electrical signal conveying the information and configured to receive a reference signal, a respective gain regulation circuit in electrical communication with the respective content signal input port to establish a respective predetermined gain upon receipt of the reference signal at the respective content signal output port and generate the respective second electrical signal by applying the respective predetermined gain to the respective one first electrical signal, and a respective control circuit disposed in electrical communication with each of the respective gain regulation circuit and the respective content signal output port to receive and measure the reference signal to establish the respective predetermined gain.

In yet another aspect of the invention, a method includes disposing a relaying device and a reference signal generator into electrical communication with opposing ends of a transmission line, sending a reference signal along the transmission line from the reference signal generator to the relaying device, establishing a predetermined gain at the relaying device, receiving a first electrical signal conveying information at the relaying device, generating a second electrical signal at the relaying device by applying the predetermined gain to the first electrical signal, the second electrical signal conveying the information of the first electrical signal, and sending the second electrical signal along the transmission line from the relaying device.

BRIEF DESCRIPTION OF THE SEVERAL VIEWS OF THE DRAWINGS

Figure 1:
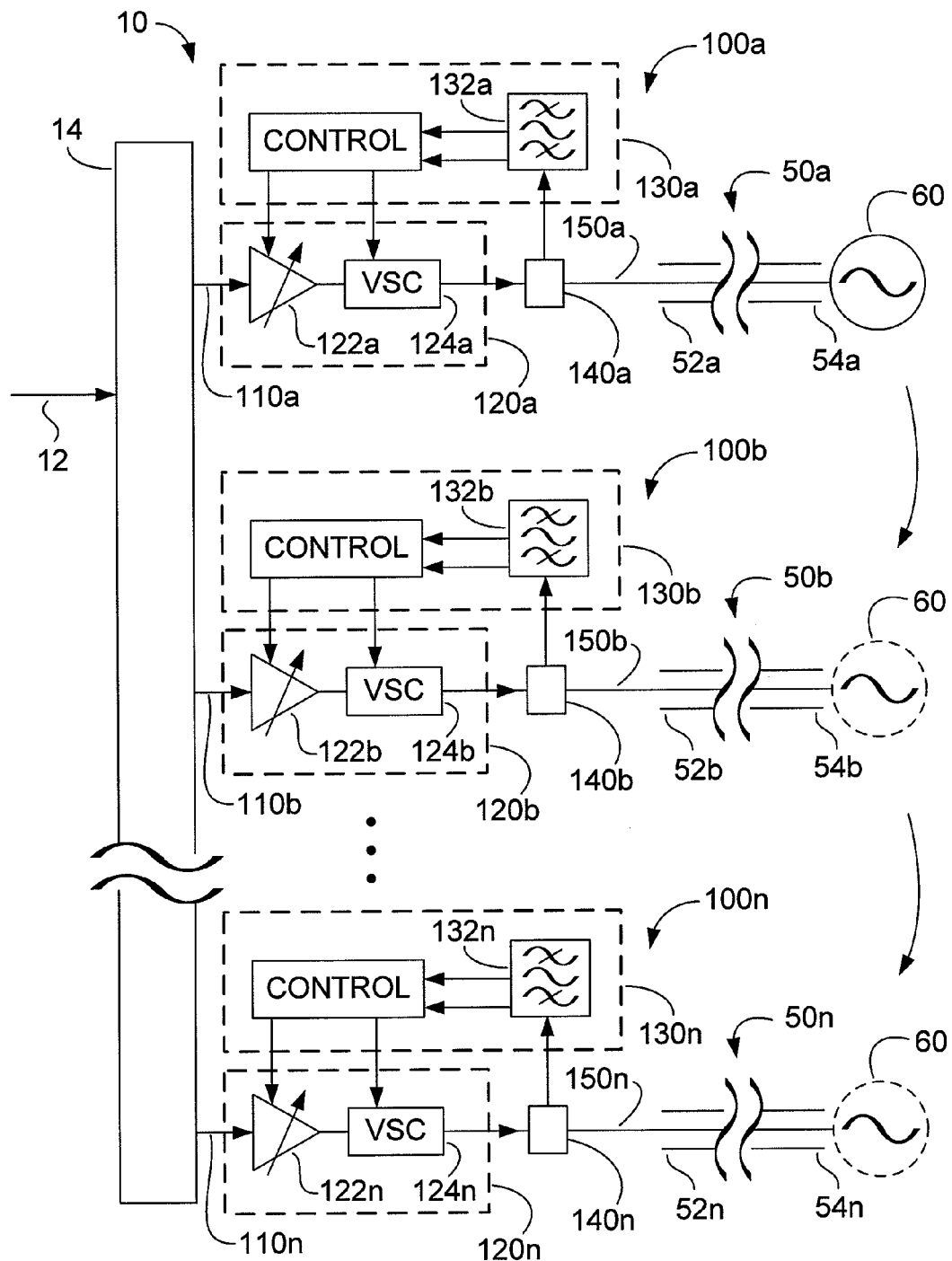
Figure 4:
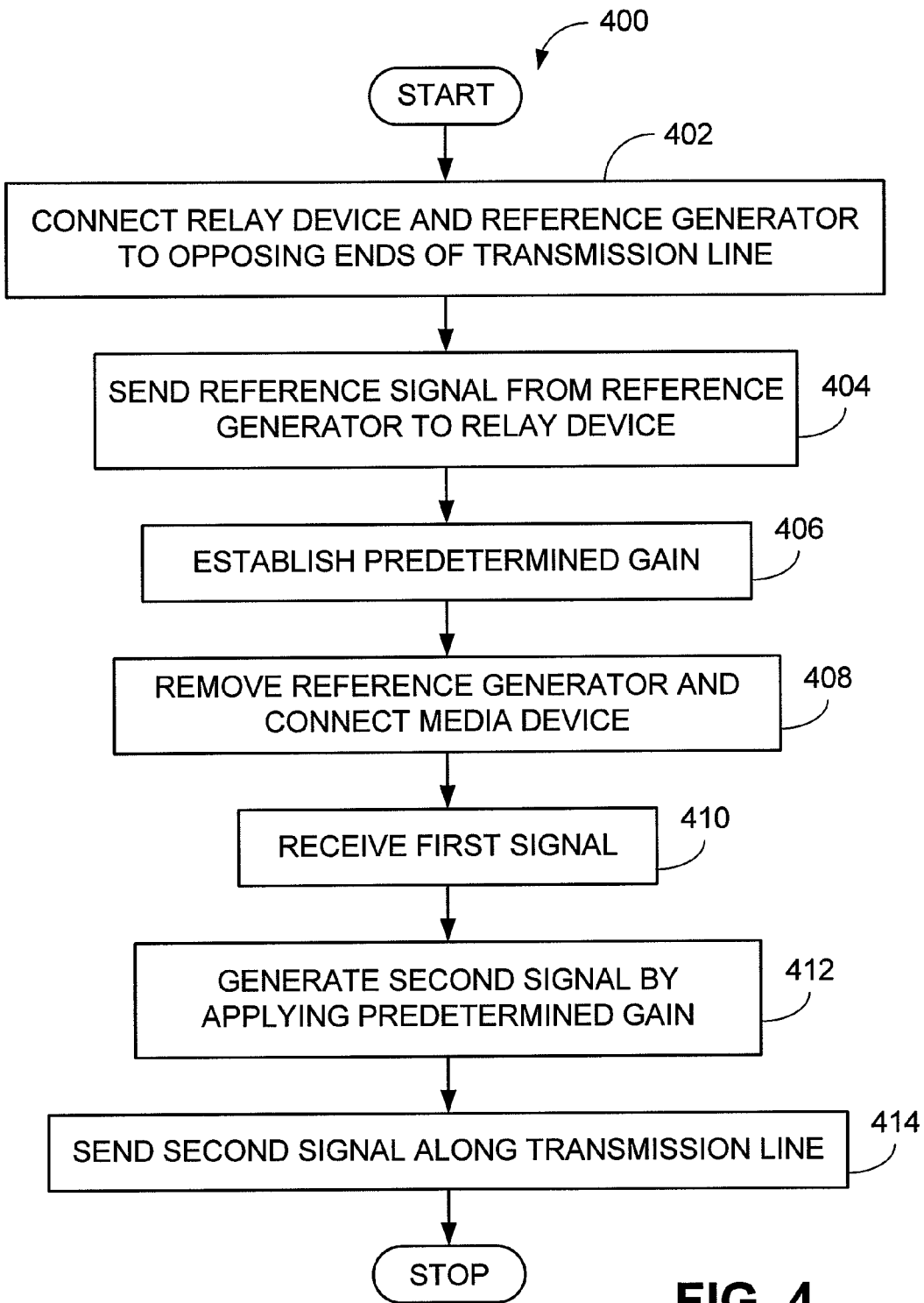

Having thus described the invention in general terms, reference will now be made to the accompanying drawings, which are not necessarily drawn to scale, and wherein:

FIG. 1 is a diagrammatic representation of a relaying assembly, having one or more relaying devices, in accordance with at least one embodiment of the invention;

FIG. 2 depicts a relaying device of FIG. 1 engaged in a media presentation scenario;

FIG. 3 depicts a relaying device of FIG. 1 engaged in a gain predetermination process; and FIG. 4 represents a method by which gain applied by a relaying device is predetermined according to at least one embodiment of the invention.

DETAILED DESCRIPTION OF THE DRAWINGS

The present invention now will be described more fully hereinafter with reference to the accompanying drawings in which some but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

A relaying assembly 10 according to at least one embodiment of the invention is diagrammatically represented in FIG. 1. The relaying assembly 10 includes a splitter 14 that receives information along a single connection 12 and provides multiple electrical signals that convey the information received by the splitter along respective connections 110a-110n. In an example described herein as the CATV example, the splitter can be a passive device that receives a multi-frequency CATV electrical signal conveying media content from a cable drop line represented by the connection 12. In that example, the electrical signal received at the connection 12 may be degraded by upstream attenuation, and each connection 110a-110n receives only some portion of the signal strength provided at the connection 12. Thus, the multiple electrical signals conveying information along the connections 110a-110n may have less than optimal signal strength for direct reception by a media presentation device. Accordingly, the connections 110a-110n represent input ports of relaying devices 100a-100n that apply gain to the electrical signals received at the connections 110a-110n. Transmission lines 50a-50n, having variable respective lengths and attenuation properties, are disposed downstream of the relaying devices. The gain applied by each relaying device is predetermined to compensate for attenuation in a particular transmission line downstream of the relaying device.

The relaying devices 100a-100n and connections 110a-110n in FIG. 1 generically represent any number of relaying devices and their respective input ports. Thus, the relaying assembly 10 may include one relaying device 100a, two relaying devices 100a and 100b, or any generic number "n" of relaying devices 100a-100n. Furthermore, the propagation of signals in the directional sense that flows from the single connection 12, through the splitter 14, through the relaying devices 100a-100n, and along the transmission lines 50a-50n from respective first ends 52a-52n to respective second ends 54a-54n of the transmission lines, is described herein as downstream propagation. Conversely, the propagation of any signal in a directional sense that is opposite downstream propagation is described herein as upstream propagation.

Though these descriptions relate as well to other examples of use for the relaying assembly 10 and elements thereof, the CATV example is referenced several further times herein. In the CATV example, the relaying assembly represents an assembly in an environment such as a home or business where several media presentation devices or recording devices are present and in which optimal signal strength at each such device is desired for accurate and reliable media content presentation or recording. For brevity, the following descriptions refer to media presentation devices and recording devices as media devices. Media devices herein include dedicated presentation and recording devices such as televisions and digital video disk (DVD) recorders as well as multifunction devices having presentation and recording capabilities such as computers. Also, media devices herein include devices in the analog and digital regimes. Accordingly, electrical signals described herein relate to various modulation schemes by which information is conveyed in analog and digital formats.

A particular relaying device 100a will now be described with reference to FIGS. 2 and 3. It should be understood that these descriptions relate as well to each of the other relaying devices 100b-100n in FIG. 1. The relaying device 100a includes a content signal input port 110a, a gain regulation circuit 120a disposed in electrical communication with the content signal input port, a content signal output port 150a disposed in electrical communication with the gain regulation circuit, and a control circuit 130a disposed in electrical communication with each of the gain regulation circuit and the content signal output port.

For convenience, these descriptions will refer to the electrical signals received by the relaying devices 100a-100n from the splitter as the first electrical signals. The first electrical signals convey information such as media content in the CATV example. These descriptions will likewise refer to second electrical signals and intermediary electrical signals, which convey the information conveyed by the first electrical signals, so that the various signals described herein can be readily differentiated by convenient terms.

The content signal input port 110a is configured to receive a first electrical signal, which conveys information, from the splitter 14. For example, the content signal input port 110a may be configured as a coaxial cable connector disposed in electrical communication with coaxial cable extending from the splitter, the content signal input port may be configured as a transmission line extending from the splitter to the gain regulation circuit 120a within a common housing that hosts the splitter and gain regulation circuit, and the content signal input port may be configured as an electrical contact connecting the splitter and gain regulation circuit.

Downstream propagation of information through the relaying device 100a may be understood in view of FIG. 2, which represents an exemplary media content presentation scenario. The gain regulation circuit 120a is configured to generate a second electrical signal, which conveys the information conveyed by the first electrical signal, upon receipt of the first electrical signal at the content signal input port 110a. To generate the second electrical signal, the gain regulation circuit applies a predetermined gain to the first electrical signal. In the CATV example, applying the predetermined gain typically results in second electrical signals having greater signal strength than that of the first electrical signals. That is, in the CATV example, the gain regulation circuit typically amplifies the first electrical signal. It should be understood, however, that these descriptions and FIGS. 1-4 relate to examples in which the gain regulation circuit increases the second electrical signal, and to examples in which the gain regulation circuit decreases the second electrical signal.

The content signal output port 150a is configured to emit the second electrical signal from the gain regulation circuit. For example, the content signal output port 150a may be configured as a coaxial cable connector, and the transmission line 50a may be configured as a coaxial cable extending from the relaying device 100a to the media device 70. Thus, the output port 150a and the transmission line 50a may be configured according to F-Type, BNC-type, and RCA-type coaxial connection standards. It should be understood that these descriptions relate to other types of output ports and transmission lines as well.

Upon generation of the second electrical signal, the information conveyed by the first electrical signal is conveyed downstream from the gain regulation circuit to the transmission line 50a, and propagates downstream along the transmission line. In a media content presentation scenario of the CATV example, a media device 70 receives the second electrical signal at the second end 54a of the transmission line 50a and presents media content conveyed by the signal as shown in FIG. 2. Presentation and recording quality and reliability at the media device are promoted by the predetermined gain applied at the gain regulation circuit.

The gain regulation circuit 120a includes an amplifier 122a disposed in electrical communication with the content signal input port 110a, and a variable slope circuit 124a disposed in electrical communication with each of the amplifier and the content signal output port 150a. In the CATV example, the amplifier 122a may be described as a drop amp. The amplifier 122a generates an intermediary signal that conveys the information conveyed by the first electrical signal by applying a first gain to the first electrical signal. The amplifier applies the first gain across the frequency domain of the field of use of the relaying device 100a. Thus, in an analog CATV example, the amplifier applies the first gain across at least the 55-550 megahertz frequency domain, and in a digital CATV example, the amplifier applies the first gain across at least the 550-860 megahertz frequency domain. In at least one embodiment, the amplifier applies the first gain at least across the 55-860 megahertz frequency domain that serves both analog and digital CATV transmissions.

A typical transmission line attenuates a propagating signal according to the frequency of the signal, with signals at higher frequencies typically suffering greater attenuation losses. For example, one hundred feet of typical RG-6 type coaxial cable frequently used in CATV signal distribution can impose approximately one decibel of attenuation upon signals at 50 megahertz and sixty decibels of attenuation upon signals at one gigahertz. Thus, in order to provide balanced signal strength at the second end 54a of the transmission line 50a across a wide frequency domain, the gain regulation circuit includes a variable slope circuit 124a that generates the second electrical signal by applying a frequency-dependent attenuation to the intermediary signal generated by the amplifier 122a. In the CATV example, it is expected that the variable slope circuit 124a applies higher attenuation at lower frequencies and lower attenuation at higher frequencies so that the combination of attenuation effects of the variable slope circuit and transmission line 50a is effectively generally uniform across the frequency domain of the field of use of the relaying device 100a. The attenuation applied by the circuit 124a is generally approximately linear as a function of frequency and thus the circuit may be described as a variable slope circuit.

The amplifier 122a and variable slope circuit 124a are disposed in serial relation to each other and thus serially combine their effects from a signal processing perspective. The combination of their effects defines the predetermined gain applied by the gain regulation circuit to the first electrical signals to generate the second electrical signals. The predetermined gain is frequency dependent according at least to the frequency dependent attenuation applied by the variable slope circuit. The first gain applied by the amplifier 122a and the attenuation applied by the variable slope circuit 124a are selected to compensate for attenuation in the particular transmission line 50a downstream of the relaying device 100a.

The serial relation of the amplifier and the variable slope circuit in FIG. 3 represents the amplifier as disposed upstream of the variable slope circuit as it may be advantageous to apply the first gain prior to applying attenuation in order to preserve the information of the first electrical signal, which may be a signal weakened by attenuation and splitting upstream of the relaying device 110a. Nonetheless, these descriptions relate as well to a relaying device in which an amplifier is disposed downstream of a variable slope circuit that applies attenuation.

The establishment of the predetermined gain applied by the relaying device 100a may be understood in view of FIG. 3. Establishing the predetermined gain entails selecting the first gain applied by the amplifier 122a and selecting the attenuation applied by the variable slope circuit 124a. As the transmission lines 50a-50n downstream of the relaying devices 100a-100n in FIG. 1 may have different lengths and attenuation properties, the predetermined gain applied by each of the relaying devices may be established similarly as shown for the device 100a in FIG. 3. In FIG. 3, a reference signal generator 60 is disposed in electrical communication with the second end 54a of the transmission line 50a. In order to provide accurate and reliable information reception at the second end 54a of the transmission line, the scenario represented in FIG. 3 would actually typically be completed prior to the media content presentation scenario in FIG. 2, which was nonetheless described first for instructive purposes.

In FIG. 3, the reference signal generator 60 provides a reference signal that propagates upstream along the transmission line 50a. The relaying device 100a includes a directional coupler 140a through which the content signal output port is disposed in electrical communication with the gain regulation circuit 120a and the control circuit 130a. The directional coupler is configured to direct the second electrical signal generated by the gain regulation circuit 120a to the content signal output port 150a, and to direct the reference signal generated by the reference signal generator 60 to the control circuit 130a. In FIG. 2, the downstream propagating second electrical signal, which conveys information such as media content, is directed from the gain regulation circuit, along the transmission line 50a, and to the media device 70. In FIG. 3, the upstream propagating reference signal is directed to the control circuit 130a. The reference signal is prevented from reaching the amplifier 122a by at least the directional coupler 140a. In the embodiment represented in FIGS. 1-3, the control circuit 130a includes a band pass-filter 132a that permits the reference signal to pass but blocks other signals. In an embodiment wherein the reference signal generator 60 generates a multi-frequency reference signal having components at various frequencies, the band-pass filter 132a is configured to pass the components at their respective frequencies. Embodiments of the control circuit may also include one or more band-pass filters, low-pass notch filters, high-pass notch filters, and band stop filters.

The relaying device 100a and the reference signal generator 60 are configured to function together to initialize the relaying device to compensate for the particular attenuation characteristics of the particular transmission line 50a. The control circuit 130a is configured to receive and measure the reference signal and to establish the predetermined gain applied by the gain regulation circuit based on the measurement of the reference signal. The control circuit 130a receives and analyzes the reference signal and determines the attenuation imposed by the particular transmission line 50a. The control circuit then establishes the predetermined gain to be applied by the gain regulation circuit in order to compensate for the determined attenuation imposed by the transmission line.

The reference signal generator, in at least one embodiment thereof, generates a reference signal having at least two components at different frequencies in order to facilitate characterization and compensation of the frequency-dependent nature of the attenuation characteristics of the transmission line. In that embodiment, the reference signal includes at least a first oscillatory electrical signal at a first frequency and a second oscillatory electrical signal at a second frequency. The control circuit 130a receives and analyzes the multi-frequency reference signal and determines the frequency-dependent attenuation imposed by the particular transmission line 50a on the upstream-propagating reference signal. The control circuit then establishes the predetermined gain to be applied by the gain regulation circuit 120a by selecting the first gain applied by the amplifier 122a and selecting the frequency-dependent attenuation applied by the variable slope circuit 124a. The control circuit 122a generates control signals to control the amplifier and variable slope circuit. The first and second frequencies may be chosen to be respectively below and above the frequency domain of the field of use of the relaying device 100a. Thus, in the CATV example, the first frequency may be chosen to be 50 megahertz or lower, and the second frequency may be chosen to be 1000 megahertz or higher. Such choices would dispose the first frequency below the 55-550 megahertz analog CATV domain and would dispose the second frequency above the 550-860 megahertz digital CATV domain.

The control circuit is configured to maintain the predetermined gain established for the gain regulation circuit after cessation of the reference signal in order for the media content presentation scenario of FIG. 2 to occur after the reference signal generator has been removed and the media device 70 has been connected to the second end 54a of the transmission line 50a. FIG. 1 represents an initialization process of the relaying assembly 10. In FIG. 1, the reference signal generator 60 is connected to the second ends 54a-54n of the transmission lines 50a-50n in any order convenient to a technician initializing the relaying assembly 10. In the CATV example, FIG. 1 relates to the installation and initialization of multiple transmission lines that extend from the relaying assembly 10 to various media devices. As each relaying device 100a is initialized by use of the reference signal generator, a respective media device can be connected to the respective transmission line 50a. Media presentation or recording at the respective media device benefits from the predetermined gain applied by the relaying device. The predetermined gain compensates for the frequency-dependent attenuation characteristics of the respective transmission line.

FIG. 4 expounds on the descriptions of FIGS. 1-3 and particularly represents a method 400 by which the gain applied by one or more relaying devices is predetermined. A transmission line is referenced in FIG. 4 and these descriptions thereof. The transmission line may be installed into a media presentation environment and is intended as a dedicated transmission line for use in conjunction with the particular relaying device under the initialization process represented in FIG. 4. In step 402, a relaying device and a reference signal generator are disposed into electrical communication with opposing ends of a transmission line. This step may be understood in view of the example in FIG. 3, wherein the relaying device 100a and the reference signal generator 60 are respectively connected to the opposing ends 52a and 54a of the transmission line 50a. Steps 404 through 406 occur automatically subsequently to step 402 in at least one embodiment of the invention. In step 404 (FIG. 4), a reference signal is sent along the transmission line from the reference signal generator to the relaying device. In the context of FIG. 3, the reference signal is further routed by the directional coupler 140a to the control circuit 130a. In step 406 (FIG. 4), a predetermined gain is established at the relaying device. For example, as described with reference to FIG. 3, the control circuit 130a receives and measures the reference signal and establishes the predetermined gain applied by the gain regulation circuit 120a. In that example, the established predetermined gain is defined by the combined effects of the first gain applied by the amplifier 122a and the frequency-dependent attenuation applied by the variable slope circuit 124a. The reference signal generator is removed from the transmission line and a media device is disposed into electrical communication with the transmission line in step 408. This can be understood as a transition from the scenario represented in FIG. 3 to the scenario represented in FIG. 2. Further steps of the method of FIG. 4 may be understood in view of the example in FIG. 2.

In step 410 (FIG. 4), a first electrical signal is received at the relaying device. The first electrical signal conveys information such as media content in the CATV example. In step 412, the relaying device generates a second electrical signal that conveys the information conveyed by the first electrical signal. In step 414, the second electrical signal is sent along the transmission line from the relaying device. These steps may be understood in view of the example in FIG. 2, wherein, in the context of the CATV example, the first electrical signal conveying media content is received at the content signal input port 110a by the relaying device 120a, which generates the second electrical signal conveying the media content, and the second electrical signal is emitted from the content signal output port 150a along the transmission line 50a toward the media device 70. Thus, in the context of the CATV example and FIG. 2, the method represented in FIG. 4 includes presenting or recording, at the media device 70, the media content conveyed by the first electrical signal.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A relaying device for conveying an electrical signal in a downstream direction from a head-end facility to an end user media device, comprising:
   a content signal input port configured to receive a downstream-propagating first electrical signal conveying information;
   a content signal output port configured to connect to one end of a transmission line an opposite end of which is to be directly coupled to an end user media device, the content signal output port further being configured to emit a downstream-propagating second electrical signal conveying the information over the transmission line for use by the end user media device, and configured to receive an upstream-propagating reference signal over the transmission line;
   a gain regulation circuit in electrical communication with the content signal input port and configured to generate the second electrical signal by applying a predetermined gain to the first electrical signal; and
   a control circuit disposed in electrical communication with each of the gain regulation circuit and the content signal output port and configured to receive and measure the reference signal received over the transmission line at the content signal output port and to establish the predetermined gain based on said measurement.

2. A relaying device according to claim 1, wherein the gain regulation circuit is configured to increase or decrease the second electrical signal by applying the predetermined gain to the first electrical signal after cessation of the reference signal.

3. A relaying device according to claim 1, wherein the predetermined gain applied by the gain regulation circuit comprises a frequency-dependent gain.

4. A relaying device according to claim 1, wherein the content signal output port is configured to emit the second electrical signal to a single cable, and to receive the reference signal from the single cable.

5. A relaying device according to claim 1, further comprising an amplifier in electrical communication with the content signal input port, and a directional coupler in electrical communication with the content signal output port, wherein the directional coupler is configured to prevent the reference signal from reaching the amplifier.

6. A relaying device according to claim 1, wherein the gain regulation circuit comprises:
   an amplifier in electrical communication with the content signal input port, the amplifier configured to generate an intermediary electrical signal conveying the information upon receipt of the first electrical signal at the content signal input port by applying a first gain to the first electrical signal; and
   a variable slope circuit in electrical communication with the amplifier, the variable slope circuit configured to receive the intermediary electrical signal and to generate the second electrical signal by applying a frequency-dependent attenuation to the intermediary electrical signal.

7. A relaying device according to claim 6, wherein the control circuit is disposed in electrical communication with each of the amplifier and the variable slope circuit, and wherein the control circuit is configured to select the first gain and the frequency-dependent attenuation.

8. A relaying device according to claim 1, further comprising a directional coupler through which the content signal output port is in electrical communication with each of the gain regulation circuit and the control circuit, wherein the directional coupler is configured to direct the second electrical signal from the gain regulation circuit to the content signal output port and to direct the reference signal from the content signal output port to the control circuit.

9. A relaying device according to claim 1, wherein the control circuit is configured to receive a reference signal comprising a first oscillatory signal at a first frequency and a second oscillatory signal at a second frequency, wherein the first frequency and the second frequency are different.

10. A relaying device according to claim 9, wherein the control circuit comprises a band-pass filter assembly configured to pass the first oscillatory signal at the first frequency and the second oscillatory signal at the second frequency.

11. A relaying device according to claim 9, wherein the control circuit comprises at least one of a band-pass filter, a low-pass notch filter, a high-pass notch filter, and a band stop filter.

12. A relaying assembly comprising:
   a splitter configured to receive information and to provide multiple downstream-propagating first electrical signals each conveying the information;
   a plurality of relaying devices, each comprising:
      a respective content signal input port disposed in electrical communication with the splitter and configured to receive a respective one of said downstream-propagating first electrical signals;
      a respective content signal output port configured to connect to one end of a respective transmission line an opposite end of which is to be directly coupled to a respective end user media device, the content signal output port further being configured to emit a respective downstream-propagating second electrical signal conveying the information over the respective transmission line for use by the respective end user media device, and configured to receive a respective upstream-propagating reference signal over the respective transmission line;
      a respective gain regulation circuit in electrical communication with the respective content signal input port and configured to generate the respective second electrical signal by applying a respective predetermined gain to the respective first electrical signal; and,
      a respective control circuit disposed in electrical communication with each of the respective gain regulation circuit and the respective content signal output port and configured to receive and measure the reference signal received over the respective transmission line at the content signal output port and to establish the respective predetermined gain based on said measurement.

13. A relaying assembly according to claim 12, further comprising a reference signal generator configured to send the reference signal to any one of the relaying devices at a time.

14. A relaying assembly according to claim 12, further comprising:
   a plurality of transmission lines, each disposed in electrical communication with a respective content signal output port;
   a reference signal generator disposed in electrical communication with a particular one of the transmission lines.

15. A method comprising:
   connecting an output port of a relaying device to a first end of a transmission line and directly coupling a reference signal generator to an opposite second end of the transmission line;
   sending an upstream-propagating reference signal along the transmission line from the reference signal generator to the relaying device;
   establishing a predetermined gain at the relaying device based on a measurement of the reference signal;
   receiving a downstream-propagating first electrical signal conveying information at an input port of the relaying device;
   generating a second electrical signal at the relaying device by applying the predetermined gain to the first electrical signal, the second electrical signal conveying the information of the first electrical signal; and
   sending the second electrical signal in a downstream direction along the transmission line from the relaying device.

16. A method according to claim 15, wherein the information conveyed by the first electrical signal comprises media content conveyed by the first electrical signal, and wherein the method further comprises:
   removing the reference signal generator from electrical communication with the transmission line;
   disposing a presentation device into electrical communication with the transmission line; and
   presenting the media content conveyed by the first electrical signal.

17. A method according to claim 15, further comprising installing the transmission line into a media presentation environment.

18. A method according to claim 17, wherein establishing the predetermined gain comprises measuring the reference signal at the relaying device and establishing the predetermined gain based on the measurement of the reference signal.

19. A method according to claim 15, wherein establishing the predetermined gain comprises selecting a first gain and a frequency-dependent attenuation.

20. A method according to claim 15, wherein generating a second electrical signal at the relaying device comprises applying the first gain and the frequency-dependent attenuation to the first electrical signal.

21. A method according to claim 15, wherein establishing the predetermined gain comprises analyzing the reference signal, determining a frequency-dependent attenuation imposed by the transmission line on the reference signal, and selecting a first gain and a frequency-dependent attenuation to compensate for the frequency-dependent attenuation imposed by the transmission line.

22. A method according to claim 15, wherein generating the second electrical signal at the relaying device by applying the predetermined gain to the first electrical signal comprises increasing or decreasing the second electrical signal by applying the predetermined gain to the first electrical signal after cessation of the reference signal.

* * * * *